(12) United States Patent
Fukunaga

(10) Patent No.: US 7,202,601 B2
(45) Date of Patent: *Apr. 10, 2007

(54) CAMERA, PORTABLE TELEPHONE, AND COMPUTER

(75) Inventor: Takeshi Fukunaga, Kanagawa-Ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/275,909

(22) Filed: Feb. 2, 2006

(65) Prior Publication Data

US 2006/0125377 A1    Jun. 15, 2006

Related U.S. Application Data

(63) Continuation of application No. 09/915,460, filed on Jul. 25, 2001, now Pat. No. 7,019,457.

(30) Foreign Application Priority Data

Aug. 3, 2000    (JP)    ............... 2000-236148

(51) Int. Cl.
*H05B 33/26* (2006.01)
*H05B 33/14* (2006.01)

(52) U.S. Cl. .................... 313/506; 313/505

(58) Field of Classification Search ........... 313/506, 313/504–505, 512
See application file for complete search history.

(56) References Cited

U.S. PATENT DOCUMENTS

| | | | |
|---|---|---|---|
| 5,742,129 A | 4/1998 | Nagayama | |
| 5,853,905 A | 12/1998 | So | |
| 5,977,562 A | 11/1999 | Hirakata | |
| 6,054,809 A | 4/2000 | Haynes | |
| 6,246,179 B1 | 6/2001 | Yamada | |
| 6,268,617 B1 | 7/2001 | Hirakat | |
| 6,307,528 B1 | 10/2001 | Yap | |
| 6,380,687 B1 | 4/2002 | Yamazaki | |
| 6,384,427 B1 * | 5/2002 | Yamazaki et al. | ............ 257/59 |
| 6,512,271 B1 | 1/2003 | Yamazaki | |
| 6,569,544 B1 | 5/2003 | Alain | |
| 6,603,140 B2 | 8/2003 | Kobori | |
| 7,019,457 B2 * | 3/2006 | Fukunaga | .............. 313/506 |
| 2001/0049030 A1 | 12/2001 | Okada | |

FOREIGN PATENT DOCUMENTS

JP    05-202356    8/1993

* cited by examiner

*Primary Examiner*—Karabi Guharay
(74) *Attorney, Agent, or Firm*—Fish & Richardson P.C.

(57) ABSTRACT

In order to emit light from the upper side of a substrate, for example, a treatment is required such that a cathode is thinned. Generally, when light produced in a light emitting layer is passed through the electrode, brightness of a light emitting device is decreased. In the light emitting device of the present invention, an anode and a cathode are located so as to produce an electric field in a direction parallel with the surface of a substrate. Thus, light produced in the light emitting layer is emitted from the lower side or the upper side of the substrate without passing through the electrode.

21 Claims, 13 Drawing Sheets

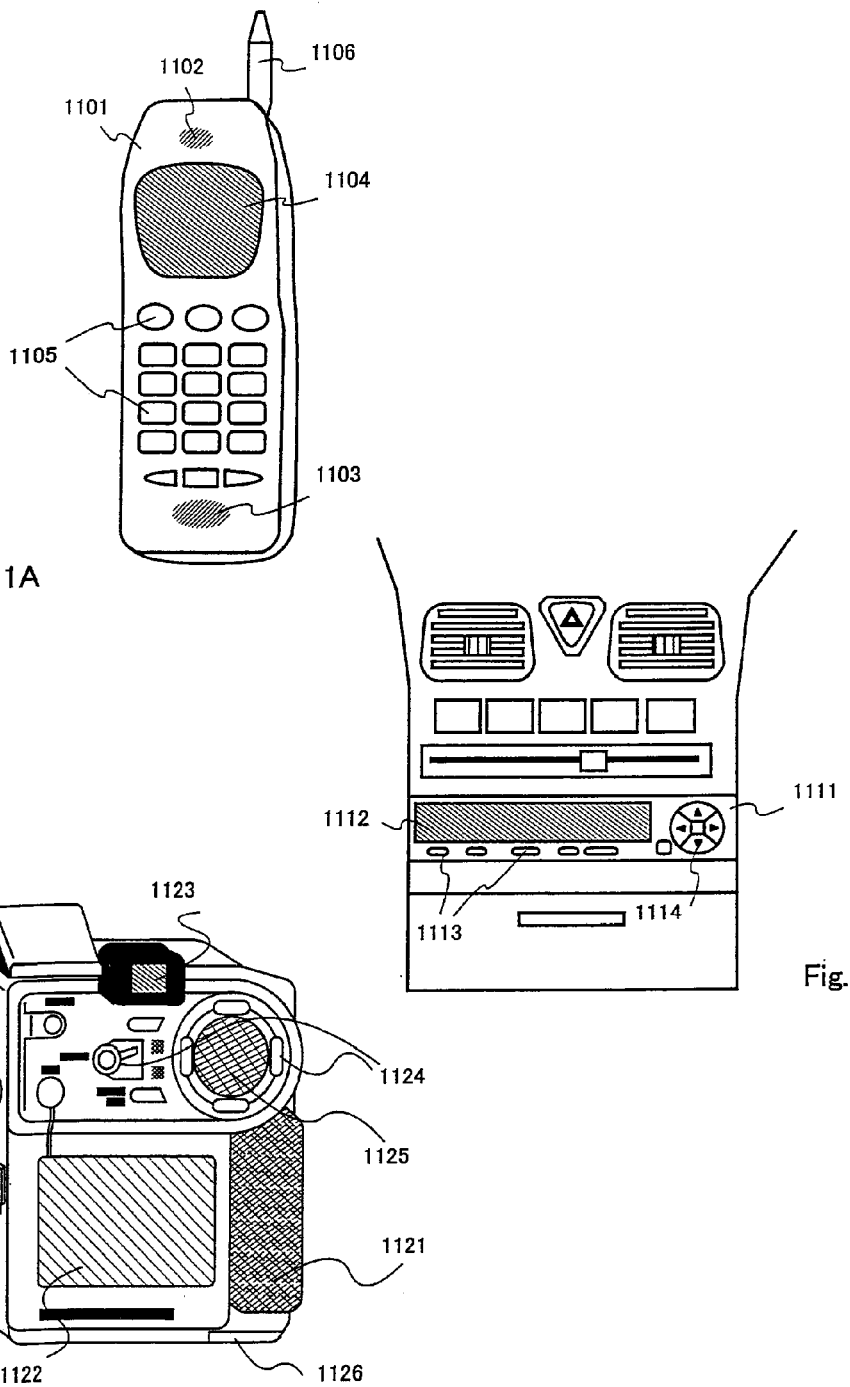

CAMERA, PORTABLE TELEPHONE, AND COMPUTER

BACKGROUND OF THE INVENTION

1. Field of the Invention

The present invention relates to a light emitting device employing an element in which a luminescent material is sandwiched between electrodes (hereinafter referred to as a light emitting element), and in particular, a light emitting device employing a luminescent material in which EL (Electro Luminescence) is produced (hereinafter referred to as an EL material).

2. Description of the Related Art

Recently, a development of the light emitting device employing a light emitting element with an EL phenomenon has been progressed. Since the light emitting element itself has luminescent capability, a back light as used in a liquid crystal display device is not required. Further, since the light emitting device has a wide viewing angle, it is suitable for outdoor use.

As the light emitting device, there are two types, that is, a passive type (simple matrix type) and an active type (active matrix type), and both types have been greatly developed. In particular, currently, the active matrix light emitting device is noted. Also, as the EL material that becomes a light emitting layer of the light emitting element, there are an organic material and an inorganic material. Further, the organic material is classified into a low molecular system (monomer system) organic material and a polymer (polymer system) organic material. Both materials are greatly studied. The low molecular system organic material is formed mainly by evaporation and the polymer organic material is formed mainly by an applying method.

The organic material has a characteristic such that the luminescent efficiency is high and it can be driven with a low voltage compared with the inorganic material. Also, since it is an organic compound, various novel substances can be designed and produced. Thus, there is possibility that an element for emitting light with higher efficiency is discovered by the progress of a future material design.

When plural kinds of EL materials are laminated and thus functions of respective layers are separated from one another, the high efficiency of the light emitting element using the organic material is achieved. Generally, the light emitting element has a laminate structure as shown in FIG. 8. In this structure, light produced in the light emitting layer cannot be emitted unless the light is passed through an electrode. Generally, a transparent conductive film (typically, a compound of indium oxide and tin oxide, or the like) is used as an anode to emit light from the anode side. In addition, generally, a cathode in which a work function is small is not transparent. Thus, in order to emit light from the upper side of a substrate, for example, a treatment is required such that the cathode is thinned. Generally, when the emitted light is passed through the electrode, brightness of the light emitting element is decreased.

Generally, the light emitting element has the laminate structure as shown in FIG. 8. When such a laminate structure is obtained, light produced in the light emitting layer is cannot be emitted from the surface of the substrate or the surface of a sealing material unless the light is passed through the anode or the cathode. When light is emitted from the light emitting element, generally, the transparent conductive film (compound of indium oxide and tin oxide) is used as the anode to emit light from the lower side of the substrate. In addition, in the light emitting element, although the cathode in which a work function is small is used, its substance is not generally transparent. Thus, when light is emitted from the upper side of the substrate, for example, a treatment is required such that the cathode is thinned. Generally, when the light produced in the light emitting layer is passed through the electrode, external quantum efficiency of the light emitting element is decreased.

SUMMARY OF THE INVENTION

According to the present invention, a light emitting device having a structure different from that of an existing light emitting device is proposed. The existing light emitting device has the structure as shown in FIG. 8. In this structure, the anode and the cathode are located so as to produce an electric field with a direction vertical to the surface of the substrate. The light emitting device of the present invention is characterized in which the anode and the cathode are located so as to produce an electric field with a direction parallel with the surface of the substrate, as shown in FIG. 4. Thus, light produced in the light emitting layer can be emitted from the lower side or the upper side of the substrate without passing through the electrode.

In FIG. 12, when an angle formed by the side surface of the electrode and the surface of the substrate is given as "A", the angle "A" is set to be 30° to 90° (preferably, 50° to 70°). When the angle "A" is made small, a film can be formed such that a change in the thickness of the light emitting layer is less in corner portions of the electrode and portions in which the electrode is in contact with the surface of the substrate.

When a transparent substrate is used, the light emitting device for emitting light from the lower side of the substrate can be obtained. When a transparent sealing member is used, the light emitting device for emitting light from the upper side of the substrate can be obtained. When a transparent substrate and a transparent sealing member are used, the light emitting device for emitting light from both the lower side and the upper side of the substrate can be obtained. In this specification, the sealing member is adhered to the substrate so as to protect the light emitting device sensitive to water and oxygen. As the sealing member, glass or stainless is generally used.

The present invention is characterized in which a reflective film is provided outside the light emitting device. As a material of the reflective film, titanium, aluminum, alloy of titanium and aluminum, silver, or silver alloy is used. When light is emitted from the lower side of the substrate, the reflective film is formed between the light emitting layer and the sealing member. On the other hand, when light is emitted from the upper side of the substrate, the reflective film is formed between the light emitting layer and the substrate.

Note that, the light emitting device in this specification includes a light emitting device for displaying character information or image information or a light emitting device used as a light source.

Note that, the light emitting device of the present invention includes a light emitting device for emitting light with at least one of a singlet excitation state and a triplet excitation state.

BRIEF DESCRIPTION OF THE DRAWINGS

In the accompanying drawings:

FIGS. 11A to 11c show electric equipment of the present invention;

DETAILED DESCRIPTION OF THE PREFERRED EMBODIMENTS

Embodiment 1

Figure 1:
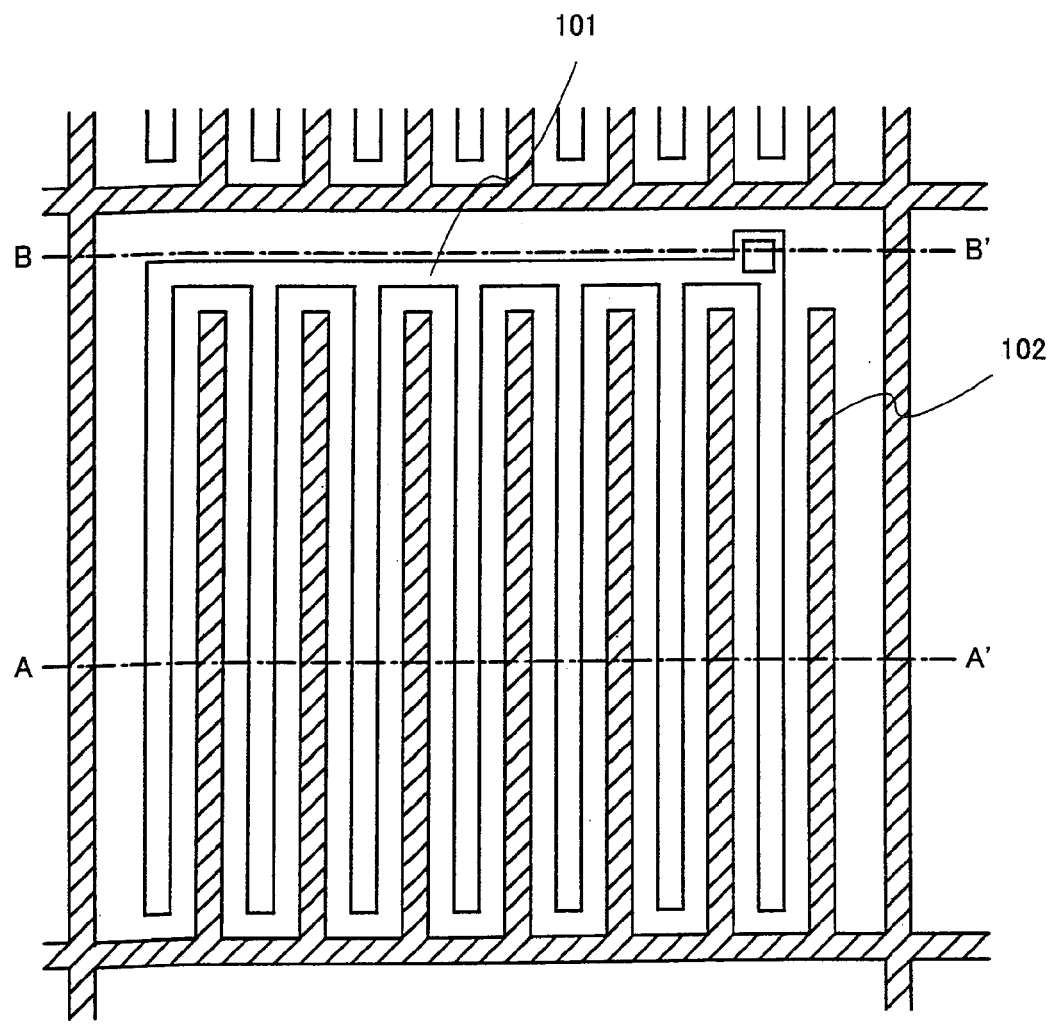
FIG. 1 shows a top structure of a light emitting device.
Figure 2:
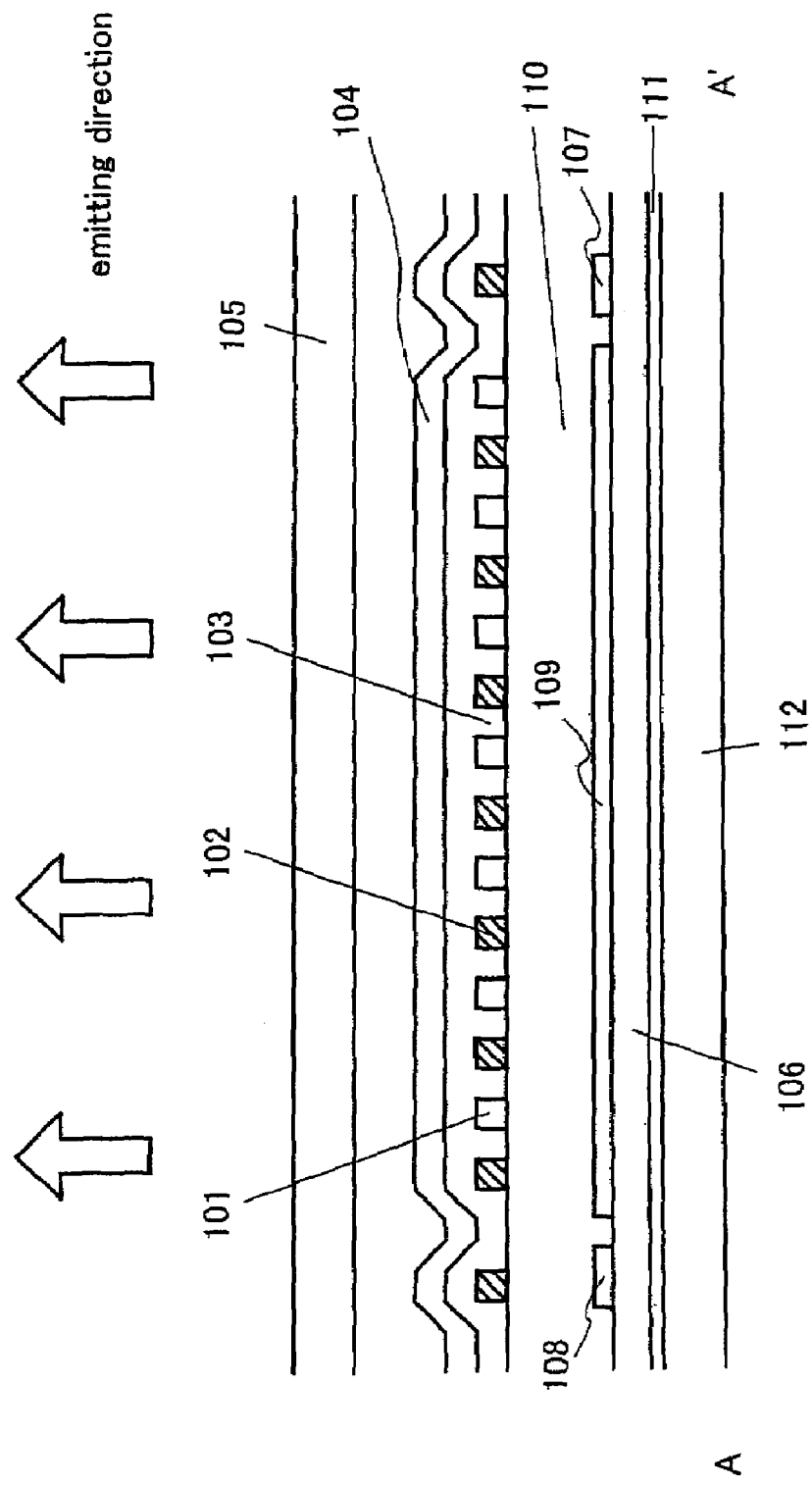
FIG. 2 shows a cross sectional structure of the light emitting device.
Figure 9:
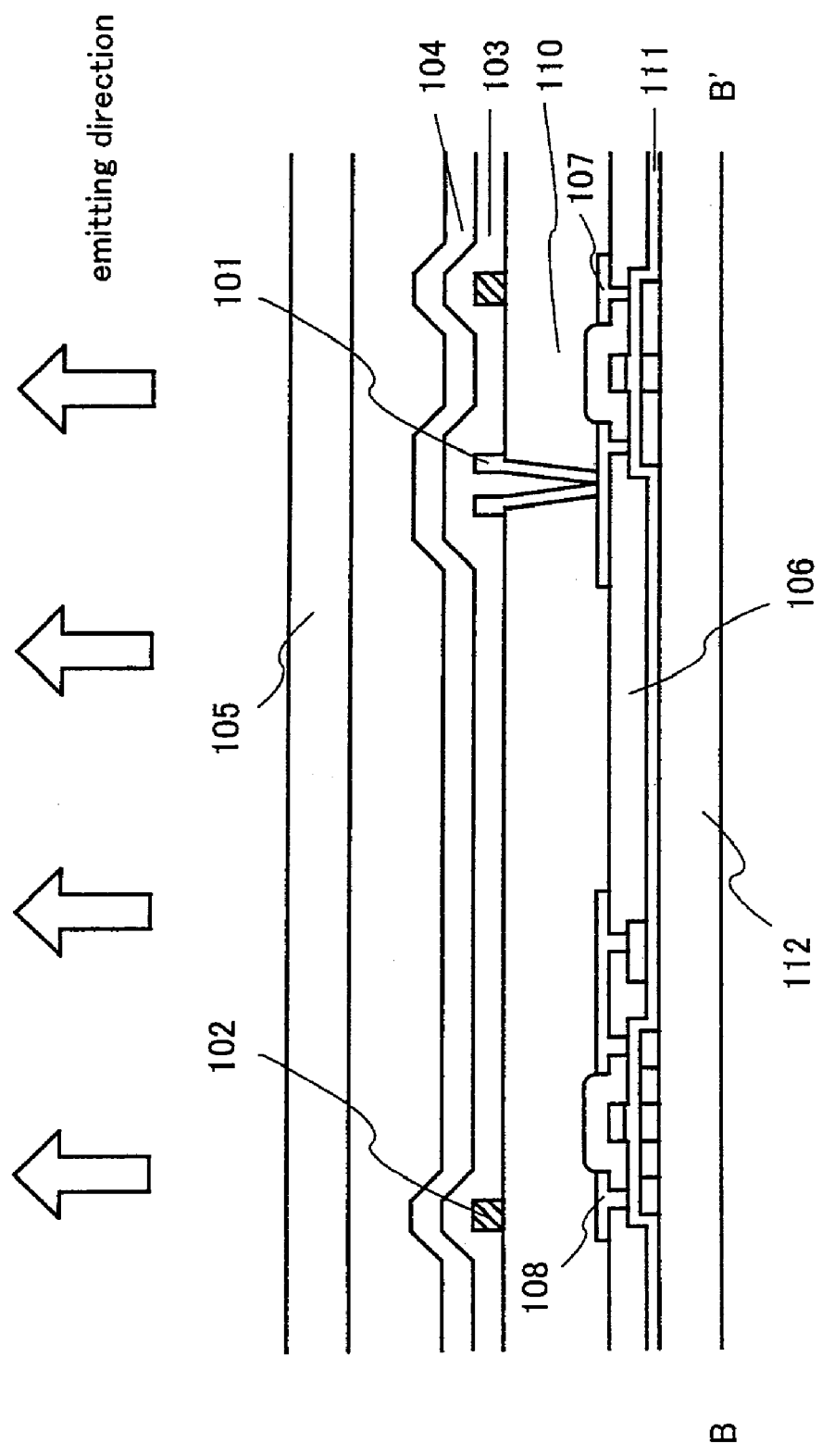
FIG. 9 shows a cross sectional structure of the light emitting device.

A light emitting device of the present invention will be described using FIGS. 1 and 2. FIG. 1 is a top view of one pixel provided in the light emitting device. Here, a cross sectional view corresponding to a cross section cut along a line A–A' in FIG. 1 is shown in FIG. 2 and a cross sectional view corresponding to a cross section cut along a line B–B' in FIG. 1 is shown in FIG. 9. Note that the same reference symbols are used for the same portions in FIGS. 1, 2, and 9.

In this embodiment, an active light emitting device will be described.

In FIG. 2, reference numeral 112 denotes a substrate and reference numeral 111 denotes an insulating film as a base. As the substrate, a silicon substrate, a glass substrate, a quartz substrate, or a plastic substrate is used. When the silicon substrate is used, minute patterning can be performed by using an existing LSI line. Thus, it is preferable to use the silicon substrate. Two or more transistors are provided in each pixel. In particular, although the number of transistors is not limited to two, the case where the two transistors are provided in each pixel will be described in this embodiment. In those transistors, one transistor has a function for switching and the other transistor has a function for current control.

A first insulating film 106 is formed on a layer that a transistor is formed. As a material of the first insulating film 106, silicon oxide, silicon nitride, or silicon oxynitride ($SiN_xO_y$, x and y are an arbitrary integer) is used. The first insulating film 106 is formed by a chemical vapor deposition method.

Wiring such as a power supply line 107 and a source line 108 are formed on the first insulating film 106. In addition, it is effective that a reflective film 109 is formed on the first insulating film 106. As a material of the reflective film 109, titanium, aluminum, alloy of titanium and aluminum, silver, or silver alloy may be used.

Next, a second insulating film 110 is formed. As a material of the second insulating film 110, an organic compound such as acrylic, polyimide, or polyimide amide is used.

Figure 3:
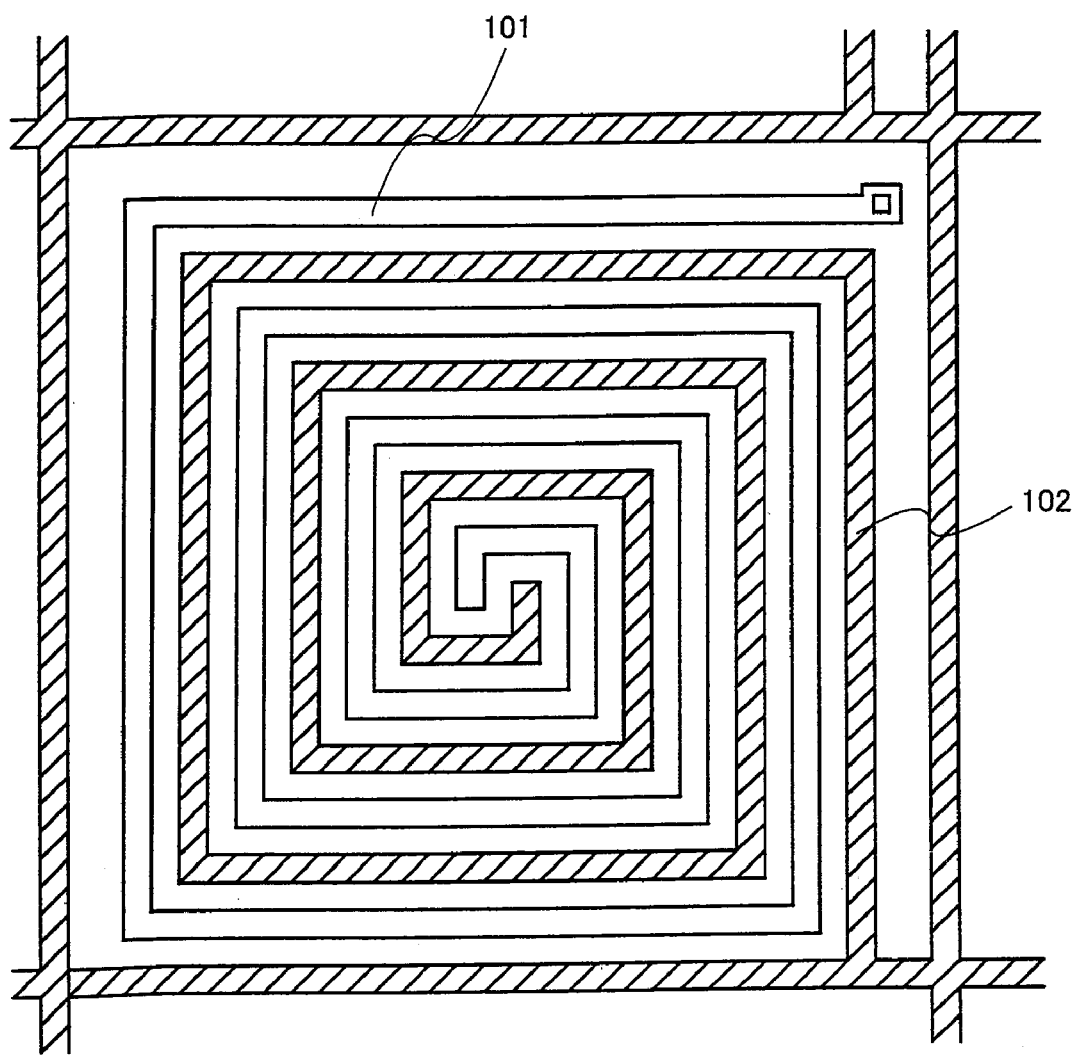
FIG. 3 shows a top structure of the light emitting device.
Figure 4:
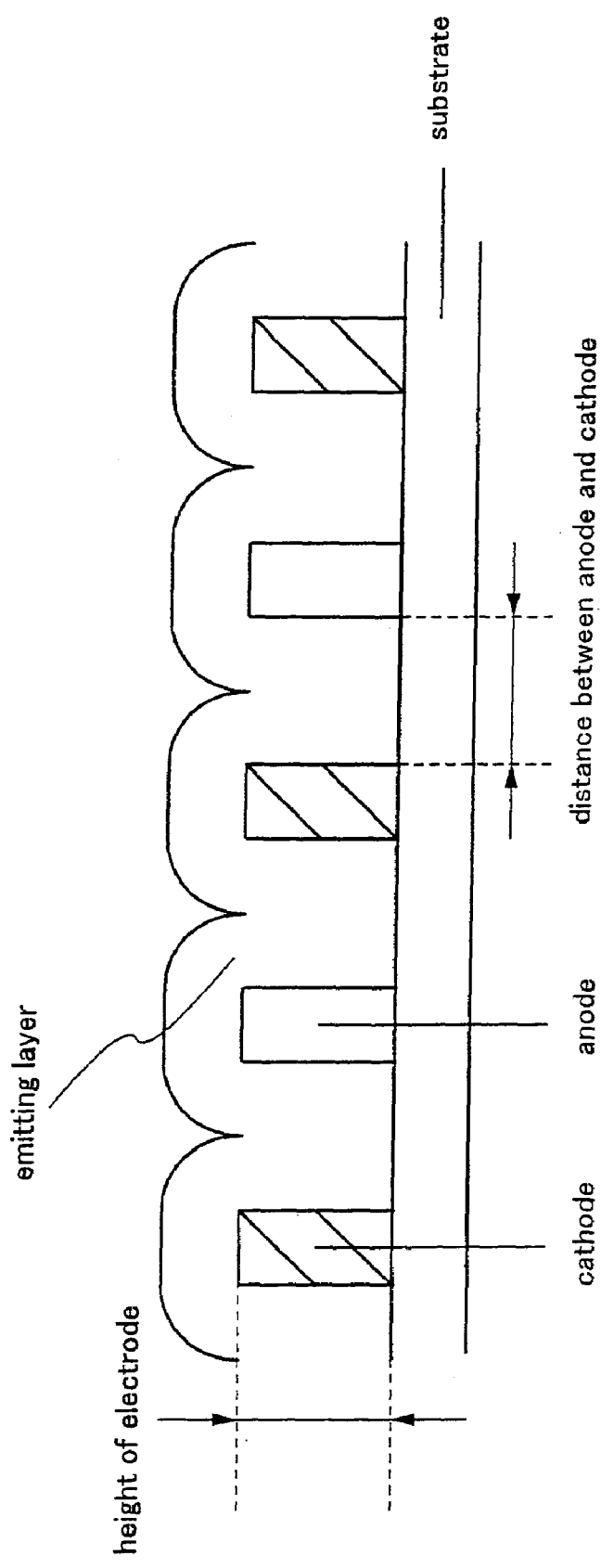
FIG. 4 shows a cross sectional structure of the light emitting device.

An anode 101 and a cathode 102 are formed on the second insulating film 110. The anode 101 and the cathode 102 are formed on the same insulator and located so as to produce an electric field with a direction parallel with a flat surface on the insulator. Concretely, as shown in FIG. 1, the anode 101 and the cathode 102 are formed with a comb tooth shape on the same insulator and located such that teeth of the anode 101 are adjacent to those of the cathode 102. In FIG. 2, it is preferable that a distance between the anode 101 and the cathode 102, which are adjacent to each other, is set to be 200 nm or shorter. If this distance is too long, a current flowing into the light emitting layer 103 is decreased. A height of those electrodes is set to be 100 nm to 500 nm. The distance between the anode and the cathode, which are adjacent to each other, and the height of the electrodes are shown in FIG. 4. Note that, the shapes of the anode 101 and the cathode 102 are not limited to the comb tooth shape as shown in FIG. 1. The following shape can be used. That is, as shown in FIG. 3, the anode 101 and the cathode 102 are formed with a spiral shape on the same insulator and located such that teeth of the anode 101 are engaged with those of the cathode 102. It is required that the anode 101 and the cathode 102 are adjacent to each other and aligned on the same insulator in the cross sectional view, as shown in FIG. 2.

As a material of the anode 101, a conductive film in which a work function is large, typically, a transparent conductive film (compound of indium oxide and tin oxide, or the like), platinum, gold, nickel, palladium, indium, or cobalt is used. The anode 101 is formed by a sputtering method, an evaporation method, or the like, and then patterned by photolithography.

As a material of the cathode 102, metal in which a work function is small, typically, an element (magnesium, lithium, potassium, barium, calcium, sodium, or beryllium) belonging to group 1 or 2 of the periodic table, or metal having a work function close to those is used. Those substances are formed by evaporation using a metal mask. In addition, as the cathode, a substance in which a work function is larger than the above metal but that is stable against water and oxygen can be used. When these substances are used, the brightness and the luminescent efficiency are reduced. However, since patterning by photolithography can be used, high precision patterning is allowed by using an existing LSI line. In case of the active light emitting device, the electrical potential of the cathode is common to all pixels. Thus, run lines that are connected with adjacent pixels in a longitudinal direction and a transverse direction are required.

As shown in FIG. 2, a light emitting layer 103 is formed to fill a space between the anode 101 and cathode 102. The light emitting layer 103 is made from a film having both a hole transport property and an electron transport property (hereinafter referred to as a bipolar layer). The bipolar layer is formed using a material having both the hole transport property and the electron transport property. Alternatively, the bipolar layer is formed by mixing a material having the hole transport property with a material having the electron transport property.

As the material having both the hole transport property and the electron transport property, a polymer material in which a low molecular material having the hole transport property and a low molecular material having the electron transport property are introduced to a basic skeleton has been proposed. In addition, a polymer material (pendant type polymer) in which the hole transport property material and the electron transport property material are introduced to a side chain to provide bipolarity, and the like have been proposed.

When the electron transport property material (typically, aluminum complex such as tris(8-quinolinolato)-aluminum or bis(2-methyl-8-quinolinolato)-(4-hydroxybiphenylato)-aluminum, zinc complex, triazole system compound such as 3-(4-tert-butylphenyl)-4-phenyl-5-(4-biphenylyl)-1,2,4-triazole, or oxadiazole system compound such as 2-biphenylyl-5-(4-tert-butylphenyl)-1,3,4-oxadiazole or 1,3-bis[5-(p-tertbutylphenyl)-1,3,4-oxadiazole-2-yl]-benzene) is doped into the polymer material having the hole transport property (typically, poly(N-vinyl)carbazole, poly-dioctylfluorene, or the like), the bipolar layer can be formed. Or, even when the low molecular material having the hole transport (typically, aromatic amine system compound such as N,N'-diphenyl-N,N'-(3-methylphenyl)-1,1'-biphenyl-4,4'-diamine or 4,4'-bis[N-(1-naphthyl)-N-phenyl-amino]biphenyl-4,4',4''-tris [N-(3-methylphenyl)-N-phenyl-amino]triphenylamine) is doped into the polymer material having the electron transport property (typically, poly-parapyridylbirylene or the like), the bipolar layer can be formed. A luminescent material ((4-dicyanomethylene-2-methyl-6-(p-dimethylamino)-styryl)-4H-pyran or the like may be doped into the bipolar layer together with the above material. In addition, it is effective to dope a material having a function for promoting luminescence together with the above material. These materials are dissolved into an organic solvent (acetone, toluene, tetrahydrofuran, or the like). Then, the light emitting layer is formed by a spin coat method, an inkjet method, a printing method, or the like using the solution in which the above materials are dissolved.

When the hole transport property material and the electron transport property material are coevaporated, the bipolar layer can be formed. A luminescent material may be evaporated on the bipolar layer together. In addition, it is effective to evaporate a material having a function for promoting luminescence together.

As a passivation film 104, a transparent film is formed on the light emitting layer 103. As the passivation film 104, a substance that is difficult for oxygen and moisture to transmitt is used. As the substance that is difficult for oxygen and moisture to transmitt, there is silicon nitride, silicon oxide, aluminum nitride, aluminum oxide, magnesium fluoride, indium oxide, or polyparaxylene.

A sealing member is formed in the outer portion of the substrate and then a sealing member 105 is adhered so as to cover the surface on which the light emitting element is formed. As a material for the sealing member 105, a transparent substance is used. The light emitting element is sealed into an enclosed space filled with an inert gas and thus completely cut off from outside air. In order to prevent the deterioration of the light emitting element, it is effective to provide a hygroscopic substance (barium oxide, calcium oxide, or zeolite) in the enclosed space. In addition, instead of an inert gas, a resin may be filled with the enclosed space. Even in this case, it is effective to add the hygroscopic substance to the resin.

Figure 7:
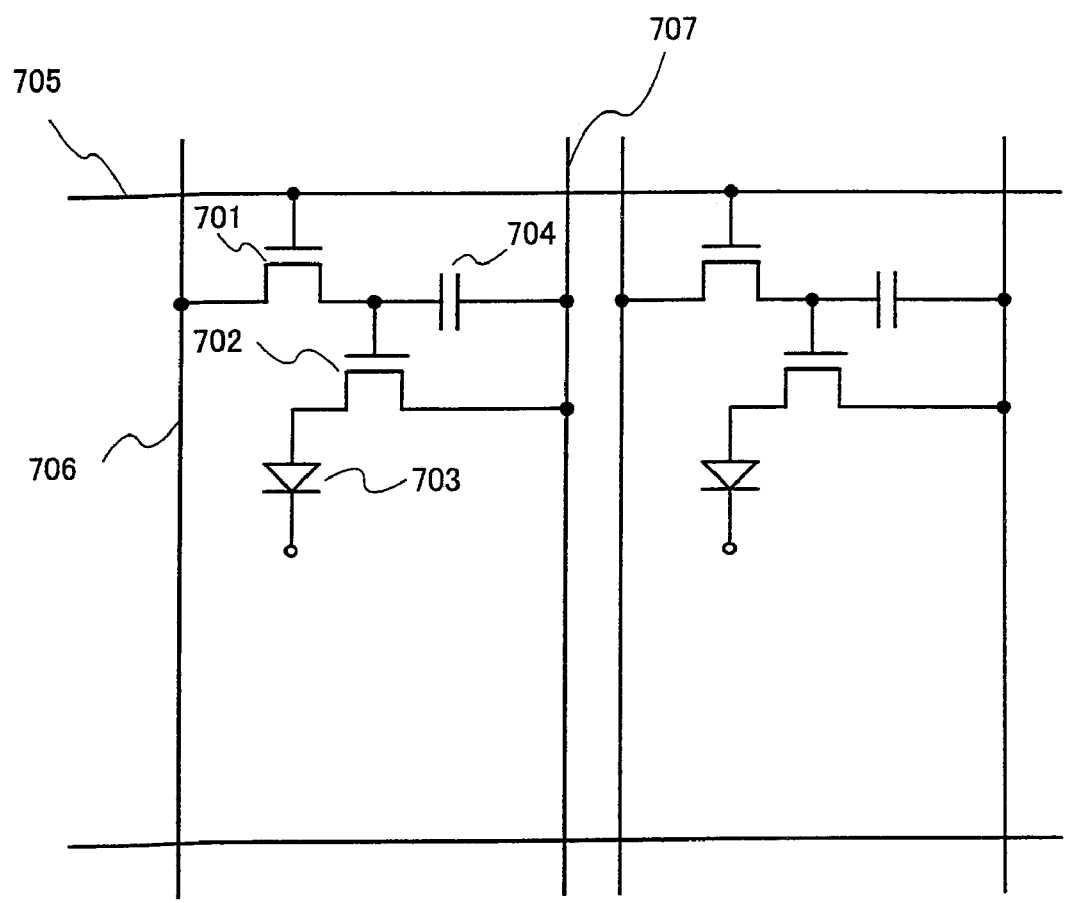
FIG. 7 shows a structure of a circuit for one pixel in the light emitting device.
Figure 8:
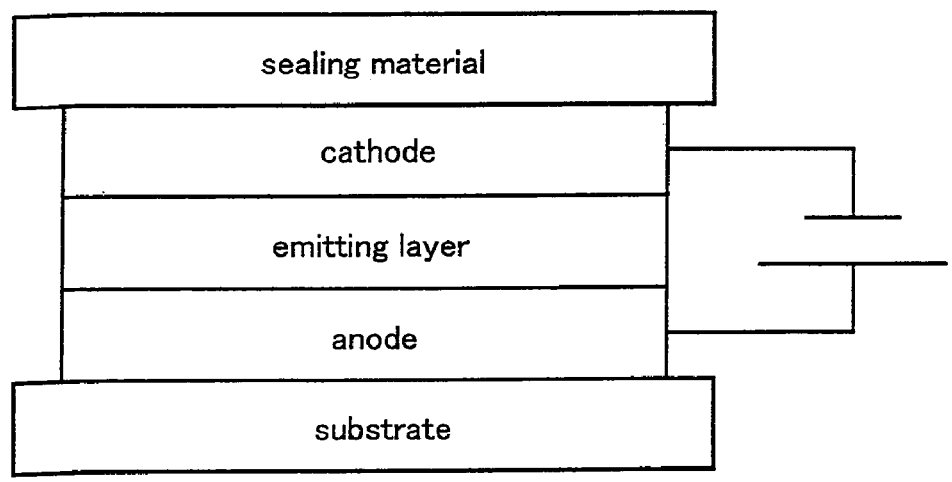
FIG. 8 shows a cross sectional structure of a conventional light emitting device.

Next, driving of the active light emitting device thus manufactured will be described using FIG. 7. Reference numeral 701 denotes a transistor that functions as a switching element, 702 denotes a transistor that functions as an element (current control element) for controlling a current supplied to a light emitting element 703, and 704 denotes a capacitor. The switching transistor 701 is connected to a gate wiring 705 and a source wiring (data wiring) 706. Also, with respect to the current control transistor 702, the drain is connected with the light emitting element 703 and the source is connected to a power supply line 707.

When the gate wiring 705 is selected, the gate of the switching transistor 701 is opened (the transistor 701 is turned on), a data signal on the source wiring 706 is stored in the capacitor 704, and the gate of the current control transistor 702 is opened (the transistor 702 is turned on). After the gate of the switching transistor 701 is closed (the transistor 701 is turned off), the gate of the current control transistor 702 is kept open by charges stored in the capacitor 704. While opening, the light emitting element emits light.

In this embodiment, light is emitted from the upper side of the substrate. However, since, of lights produced in the light emitting layer 103, light emitted to the lower side of the substrate is reflected by the reflective film 109, light can be emitted from the upper side of the substrate. Thus, since, of lights produced in the light emitting layer 103 located above, light emitted to the lower side can be effectively utilized, the external quantum efficiency is increased.

Embodiment 2

Figure 13:
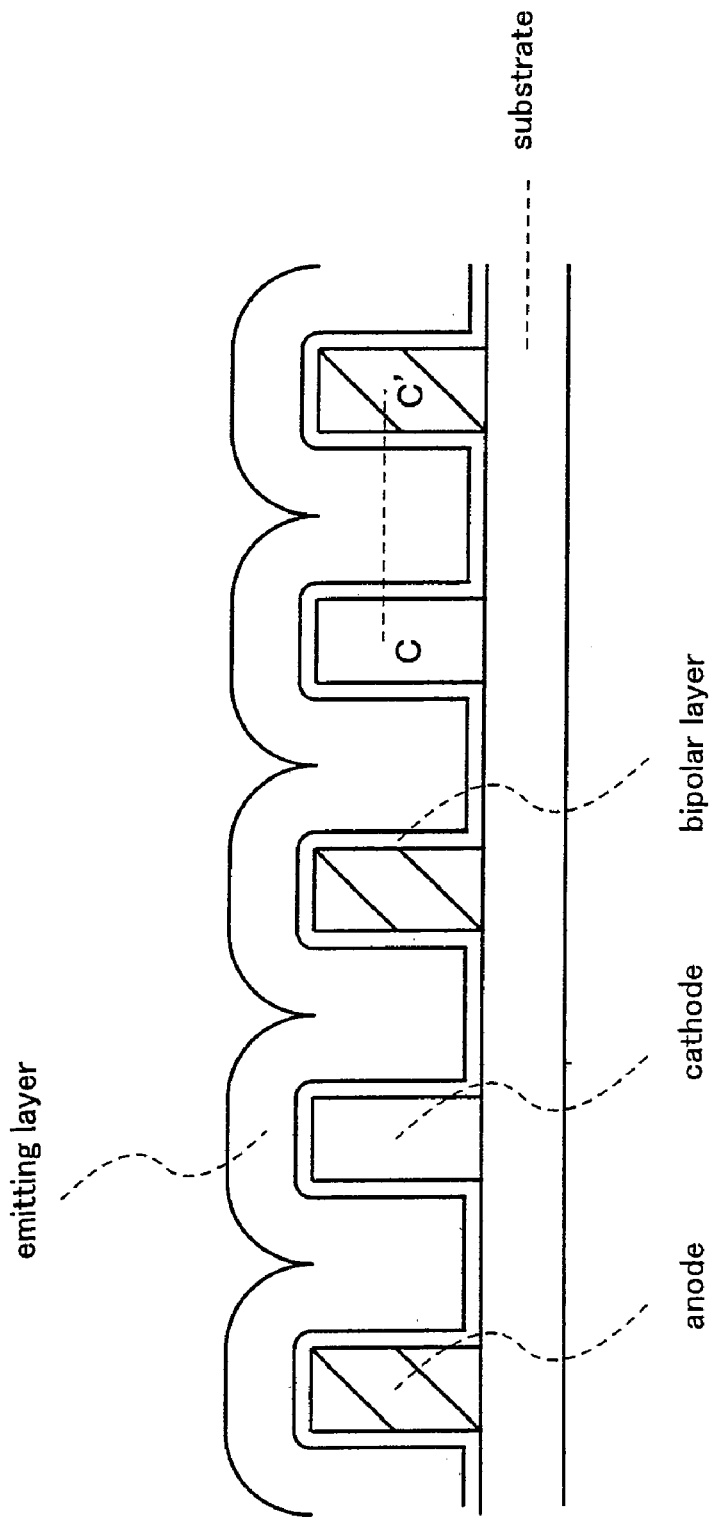
FIG. 13 shows a cross sectional structure of a light emitting device.

A light emitting device of the present invention having a structure in which a bipolar layer and a layer containing a luminescent material are laminated as a light emitting layer will be described using FIG. 13. After the cathode and the anode are formed, the bipolar layer is formed. The bipolar layer is formed by a method described in Embodiment 1. It is required that the film thickness of the bipolar layer is sufficiently smaller than the height of the electrodes. The layer containing the luminescent material is formed on the bipolar layer. As the layer containing the luminescent material, a layer made of one kind of luminescent material or a layer in which the luminescent material is mixed with a mixture made of plural kinds of materials may be used. Thus, when it is viewed along a line C–C' in FIG. 13, the light emitting element constructed by the anode, the bipolar layer, the layer containing the luminescent material, the bipolar layer, and the cathode can be obtained. Another portions are made to be the same structure as Embodiment 1.

Embodiment 3

Figure 5:
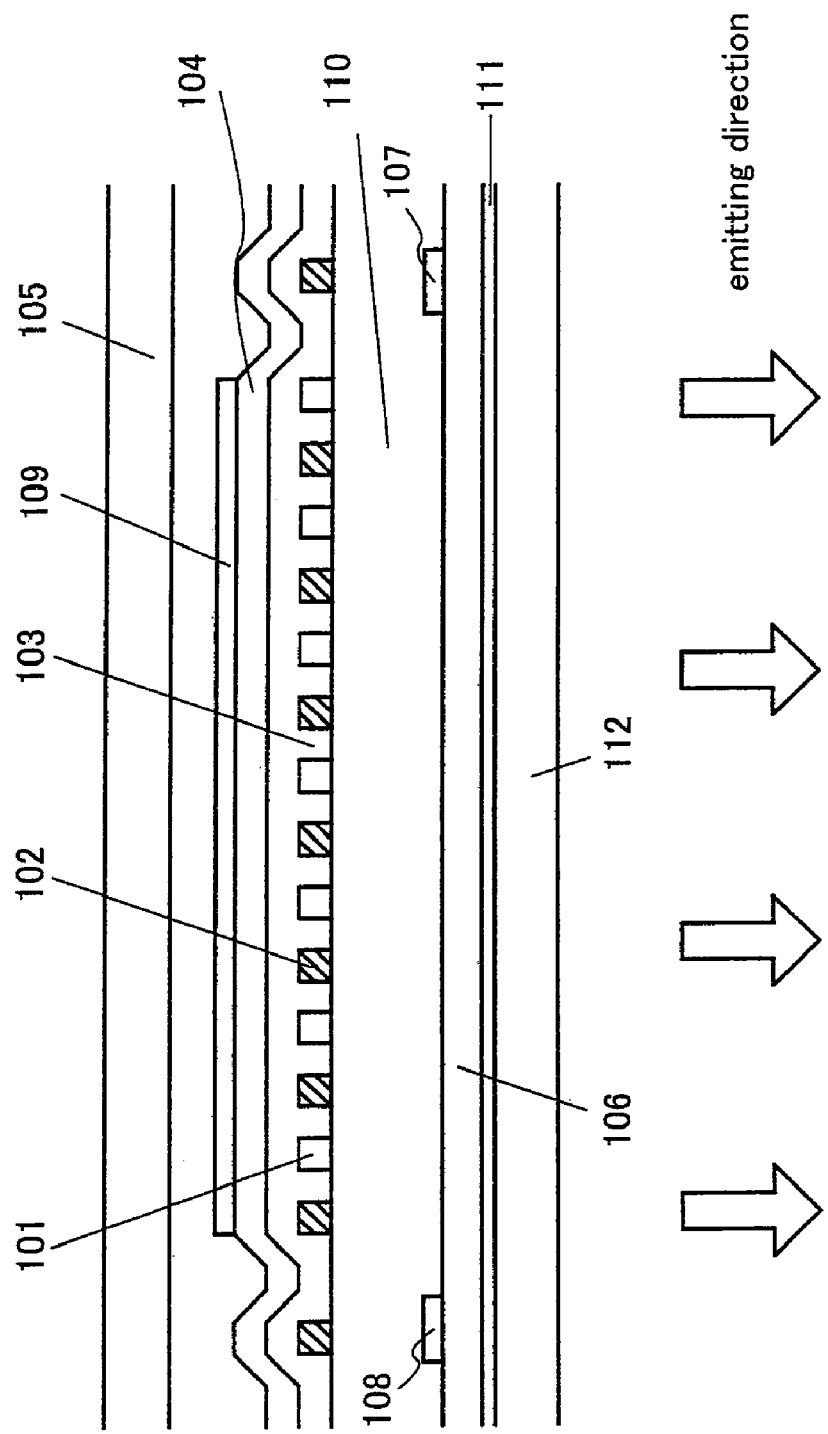
FIG. 5 shows a cross sectional structure of a light emitting device.

A light emitting device in which light is emitted from the lower side of the substrate will be described using FIG. 5. As a substrate 112, a transparent glass substrate, a quartz substrate, or a plastic substrate is used. A reflective film 109 is formed in an upper portion of a light emitting layer 103. The reflective film 109 may be formed over a passivation film 104 or under the passivation film 104. When the reflective film 109 is formed over the passivation film 104, a transparent material is used for the passivation film 104. In this structure, since, of lights produced in the light emitting layer 103, light emitted to the upper side of the substrate is reflected by the reflective film 109, light can be emitted from the lower side of the substrate. Thus, the external quantum efficiency is increased. Another portions are made to be the same structure as Embodiment 1.

Embodiment 4

Figure 6:
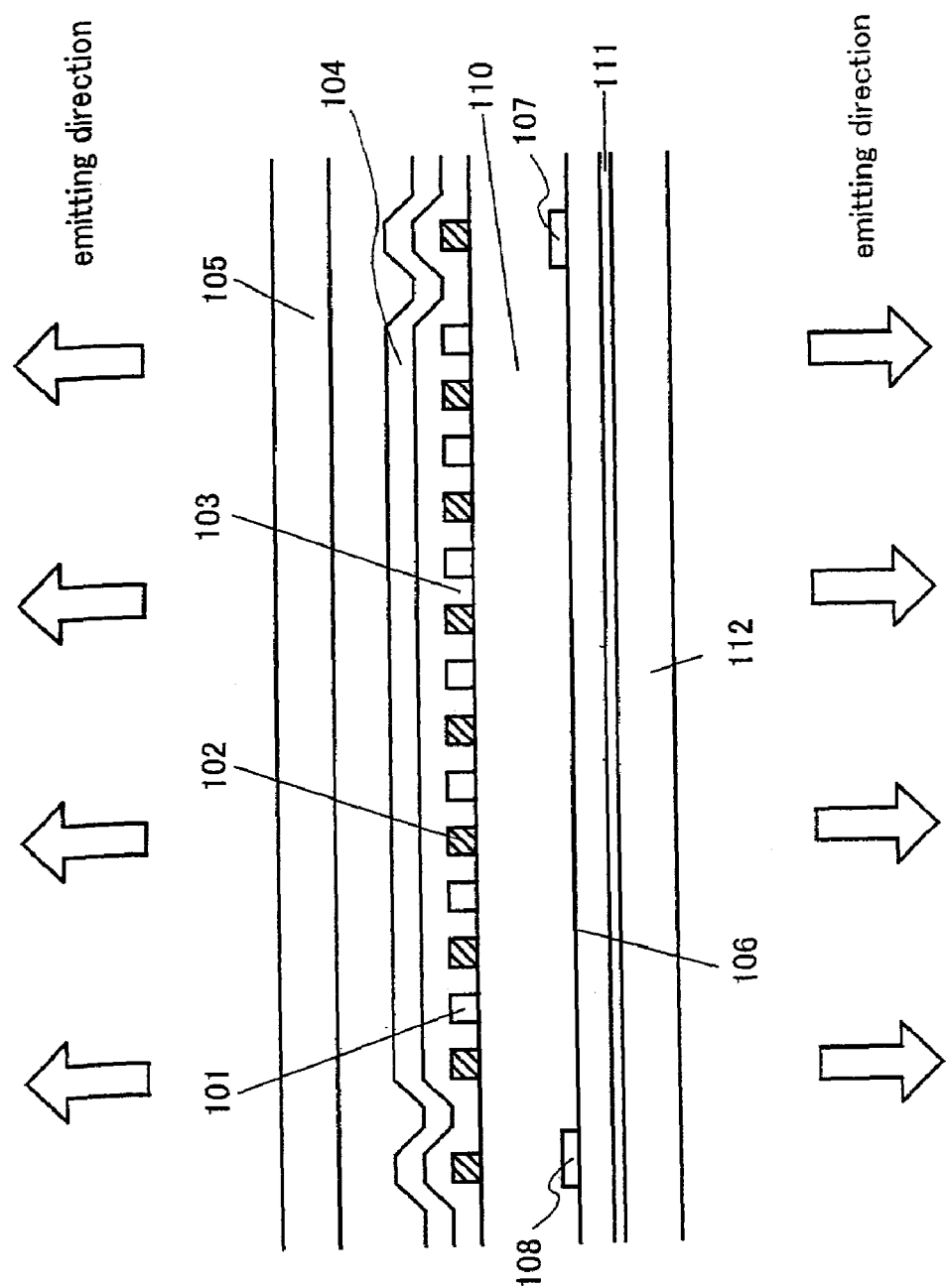
FIG. 6 shows a cross sectional structure of a light emitting device.

A light emitting device in which light is emitted from both sides of the substrate will be described using FIG. 6. As a substrate 112, a transparent glass substrate, a quartz substrate, or a plastic substrate is used. Also, a transparent material is used for a sealing member 105 and a passivation film 104. In this structure, light produced in the light emitting layer 103 can be emitted from both sides of the substrate. Another portions are made to be the same structure as Embodiment 1.

Embodiment 5

The light-emitting display device of the present invention is a self light emitting type, therefore compared to a liquid crystal display, it has excellent visible properties and is broad in an angle of visibility. Accordingly, the light-emitting display device can be applied to a display portion in various electronic devices. For example, in order to view a TV program or the like on a large-sized screen, the light-emitting display device in accordance with the present invention can be used as a display portion of a light-emitting display having a diagonal size of 30 inches or larger (typically 40 inches or larger).

The display includes all kinds of displays to be used for displaying information, such as a display for a personal computer, a display for receiving a TV broadcasting program, a display for advertisement display. Moreover, the light-emitting device in accordance with the present invention can be used as a display portion of other various electric devices.

As other electronic equipments of the present invention there are: a video camera; a digital camera; a goggle type display (head mounted display); a navigation system; a sound reproduction device (a car audio stereo and an audio set and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk player (DVD), and displays the images). In particular, because portable information terminals are often viewed from a diagonal direction, the wideness of the field of vision is regarded as very important. Thus, it is preferable that the light-emitting device is employed. Specific examples of those electronic equipments are shown in FIGS. 10A to 11C.

Figure 10A:
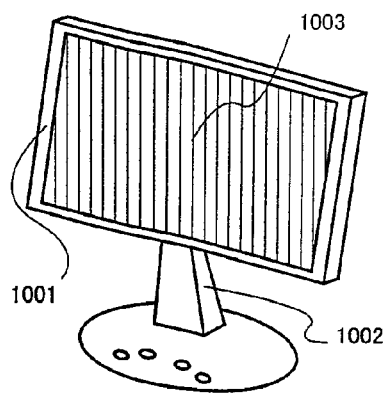
FIGS. 10A to 10F show electric equipment of a present invention.

FIG. 10A shows a display device containing a casing 1001, a support stand 1002, and a display portion 1003. The light-emitting device of the present invention can be used as the display portion 1003. Such a light-emitting device is a self light emitting type so that a back light is not necessary. Thus, the display portion can be made thinner than that of a liquid crystal display.

Figure 10B:
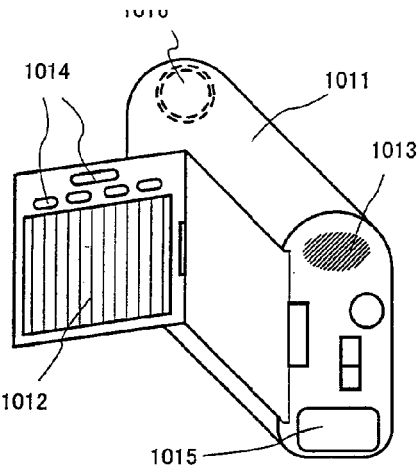

FIG. 10B shows a video camera, and contains a main body 1011, a display portion 1012, a sound input portion 1013, operation switches 1014, a battery 1015, and an image receiving portion 1016. The light-emitting device of the present invention can be used as the display portion 1012.

Figure 10C:
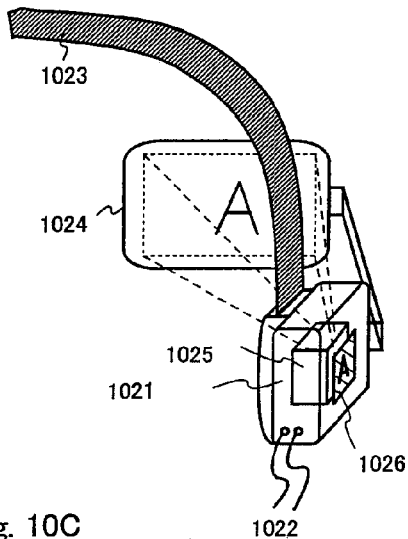

FIG. 10C shows a part of a head mounted display device (right handed side), and contains a main boy 1021, a signal cable 1022, a head fixciation band 1023, a display portion 1024, an optical system 1025 and a display device 1026. The light-emitting device of the present invention can be used as the display device 1026.

Figure 10D:
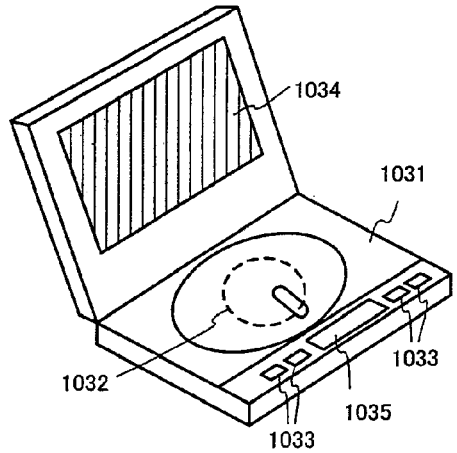

FIG. 10D is an image playback device equipped with a recording medium (specifically, a DVD playback device), and contains a main body 1031, a recording medium (such as a DVD and so forth) 1032, operation switches 1033, a display portion (a) 1034, and a display portion (b) 1035. The display portion (a) 1034 is mainly used for displaying image information. The display portion (b) 1035 is mainly used for displaying character information. The electronic device of the present invention can be used as the display portion (a) 1034 and as the display portion (b) 1035. Note that the image playback device equipped with the recording medium includes devices such as domestic game machines.

Figure 10E:
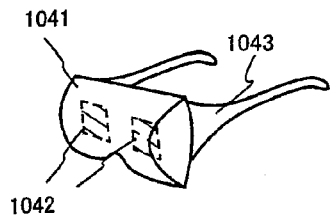
Figure 10F:
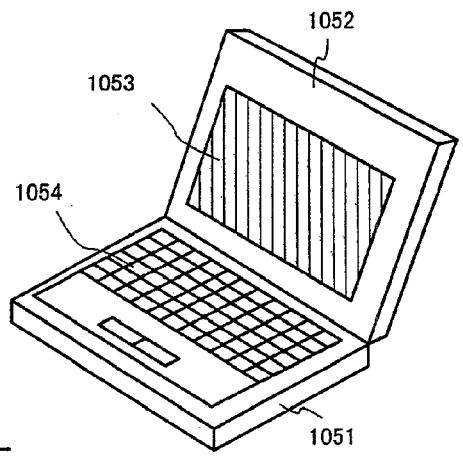
Figure 12:
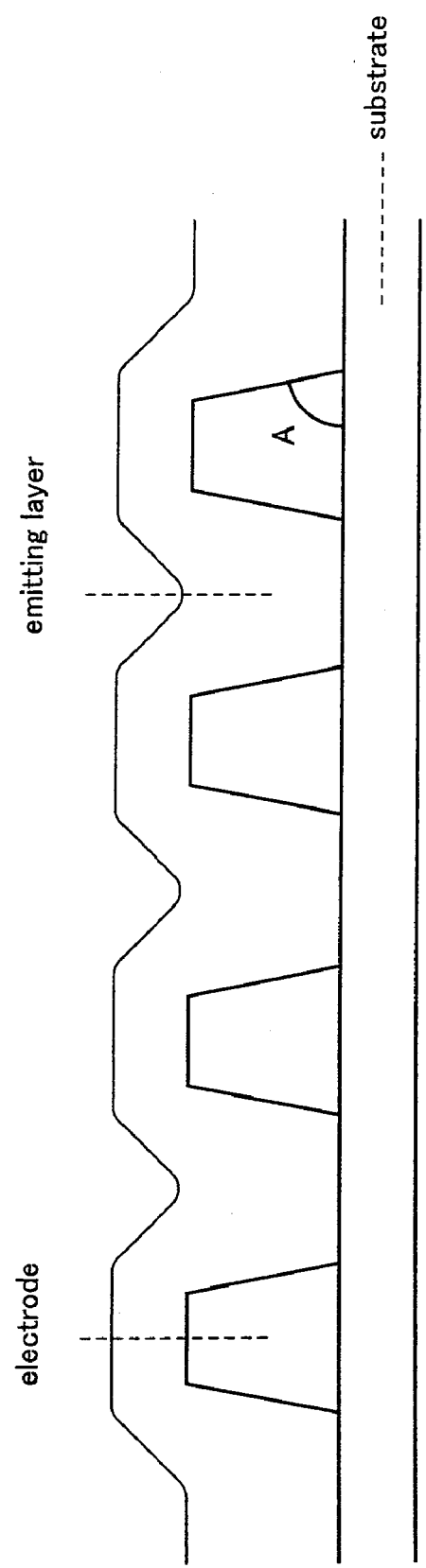
FIG. 12 shows a cross sectional structure of a light emitting device.

FIG. 10E shows a goggle type display device (a head mounted display device), and contains a main body 1041, a display portion 1042, and an arm portion 1043. The light-emitting device of the present invention can be used as the display portion 1042. FIG. 10F is a personal computer, and contains a main body 1051, a casing 1052, a display portion 1053, and a keyboard 1054. The light-emitting device of the present invention can be used as the display portion 1053.

Note that if the luminance of EL material increases in the future, then it will become possible to use the light-emitting device of the present invention in a front type or a rear type projector by expanding and projecting light containing output image information with a lens or the like.

Further, the above electronic devices display often information transmitted through an electronic communication circuit such as the Internet and CATV (cable TV), and particularly situations of displaying moving images is increasing. The response speed of EL materials is so high that the light-emitting device of the present invention are good for display of moving image.

FIG. 11A shows a portable telephone, and contains a main body 1101, a sound output portion 1102, a sound input portion 1103, a display portion 1104, operation switches 1105, and an antenna 1106. The light emitting device of the present invention can be used as the display portion 1104. Note that by displaying white color characters in a black color background, the display portion 1104 can suppress the power consumption of the portable telephone.

FIG. 11B shows a sound reproduction device, in a concrete term, a car audio stereo, and contains a main body 1111, a display portion 1112, and operation switches 1113 and 1114. The light-emitting device of the present invention can be used as the display portion 1112. Further, a car mounting audio stereo is shown in this embodiment mode, but a portable type or a domestic type sound reproduction device may also be used. Note that, the display portion 1114 can suppress the power consumption by displaying white color character in a black color background. Particularly it have an effect on the portable sound reproduction device.

FIG. 11C shows a digital camera, and contains a main body 1121, a display portion (A) 1122, an eye piece portion 1123, and an operation switches 1124, a display portion (B) 1125, a battery 1126. The electronic device of the present invention can be used as the display portion (A) 1122 and the display portion (B) 1125. Note that, in the case that the display portion (B) 1125 is used as the operation panel, the power consumption of the digital camera can suppress by displaying white color characters in a black color background.

In the case of the portable electronic device shown in this embodiment mode, the sensor portion is provided as a method of lowering the power consumption, which perceives the external light and functions to lower the brightness of display portion when it is used in the dark.

As described above, the application range of this invention is extremely wide, and it may be used for electric devices in various fields. Further, the electronic device of this embodiment mode may be obtained by freely combining the structures of first to third embodiment modes.

According to the present invention, a light emitting device having a structure in which the anode and the cathode are located so as to produce an electric field in a direction parallel with the surface of the substrate is proposed. Thus, a light emitting device for emitting light produced in the light emitting layer without passing through the electrode can be obtained. Since it is not required that a transparent conductive film is used as the anode, platinum, gold, nickel, palladium, iridium, or cobalt, which has a large work function can be used. Therefore, the light emitting efficiency is increased. In addition, since a transmittance and an aperture ratio are improved, a bright image can be obtained.

What is claimed is:
1. A camera comprising:
   a display portion, the display portion comprising:
   a substrate;
   a source wiring over the substrate;
   a gate wiring over the substrate;
   at least one thin film transistor provided in an intersection of the source wiring and the gate wiring;
   an insulator over the thin film transistor;
   a first electrode formed on the insulator;
   a second electrode formed on the insulator so as not to be in contact with the first electrode; and a light emitting layer formed between the first and second electrodes on the insulator, wherein the first and second electrodes are formed directly on the insulator, and wherein the thin film transistor is electrically connected to the first electrode.

2. A camera according to claim 1, wherein one of the first and second electrodes comprises a material selected from the group consisting of as gold, nickel, palladium, iridium, and cobalt.

3. A camera according to claim 1, wherein an angle formed by at least one of a side surface of the first electrode or the second electrode and a surface on the insulator is 30° to 90°.

4. A camera according to claim 1, wherein a distance between the first electrode and the second electrode, which are adjacent to each other, is set to be 200 nm or shorter, and height of at least one of first and second electrodes is set to be 100 nm to 500 nm.

5. A camera according to claim 1, wherein the light emitting layer comprises a first layer having an electron transport property and a hole transport property and a second layer containing a luminescent material, and the first layer is formed on the first and second electrodes and the insulator, and the second layer is formed on the first layer.

6. A camera according to claim 1, wherein the display portion further comprising:

a passivation film formed over the first and second electrodes with the light emitting layer interposed therebetween; and a reflective film formed over the first and second electrode with the passivation film interposed therebetween.

7. A camera emitting device according to claim 6, wherein the reflective film is made of one selected from the group consisting of titanium, aluminum, alloy of titanium and aluminum, silver, or silver alloy.

8. A portable telephone comprising:
a display portion, the display portion comprising:
a substrate;
a source wiring over the substrate;
a gate wiring over the substrate;
at least one thin film transistor provided in an intersection of the source wiring and the gate wiring;
an insulator over the thin film transistor;
a first electrode formed on the insulator;
a second electrode formed on the insulator so as not to be in contact with the first electrode; and
a light emitting layer formed between the first and second electrodes on the insulator,
wherein the first and second electrodes are formed directly on the insulator, and
wherein the thin film transistor is electrically connected to the first electrode.

9. A portable telephone according to claim 8, wherein one of the first and second electrodes comprises a material selected from the group consisting of as gold, nickel, palladium, iridium, and cobalt.

10. A portable telephone according to claim 8, wherein an angle formed by at least one of a side surface of the first electrode or the second electrode and a surface on the insulator is 30° to 90°.

11. A portable telephone according to claim 8, wherein a distance between the first electrode and the second electrode, which are adjacent to each other, is set to be 200 nm or shorter, and height of at least one of first and second electrodes is set to be 100 nm to 500 nm.

12. A portable telephone according to claim 8, wherein the light emitting layer comprises a first layer having an electron transport property and a hole transport property and a second layer containing a luminescent material, and the first layer is formed on the first and second electrodes and the insulator, and the second layer is formed on the first layer.

13. A portable telephone according to claim 8 wherein the display portion further comprising:

a passivation film formed over the first and second electrodes with the light emitting layer interposed therebetween; and a reflective film formed over the first and second electrode with the passivation film interposed therebetween.

14. A portable telephone according to claim 13 wherein the reflective film is made of one selected from the group consisting of titanium, aluminum, alloy of titanium and aluminum, silver, or silver alloy.

15. A computer comprising:
a display portion, the display portion comprising:
a substrate;
a source wiring over the substrate;
a gate wiring over the substrate;
at least one thin film transistor provided in an intersection of the source wiring and the gate wiring;
an insulator over the thin film transistor;
a first electrode formed on the insulator;
a second electrode formed on the insulator so as not to be in contact with the first electrode; and
a light emitting layer formed between the first and second electrodes on the insulator,
wherein the first and second electrodes are formed directly on the insulator, and
wherein the thin film transistor is electrically connected to the first electrode.

16. A computer according to claim 15, wherein one of the first and second electrodes comprises a material selected from the group consisting of as gold, nickel, palladium, iridium, and cobalt.

17. A computer according to claim 15, wherein an angle formed by at least one of a side surface of the first electrode or the second electrode and a surface on the insulator is 30° to 90°.

18. A computer according to claim 15, wherein a distance between the first electrode and the second electrode, which are adjacent to each other, is set to be 200 nm or shorter, and height of at least one of first and second electrodes is set to be 100 nm to 500 nm.

19. A computer according to claim 15, wherein the light emitting layer comprises a first layer having an electron transport property and a hole transport property and a second layer containing a luminescent material, and the first layer is formed on the first and second electrodes and the insulator, and the second layer is formed on the first layer.

20. A computer according to claim 15, wherein the display portion further comprising:

a passivation film formed over the first and second electrodes with the light emitting layer interposed therebetween; and a reflective film formed over the first and second electrode with the passivation film interposed therebetween.

21. A computer according to claim 20, wherein the reflective film is made of one selected from the group consisting of titanium, aluminum, alloy of titanium and aluminum, silver, or silver alloy.

* * * * *